(12) United States Patent
Liu et al.

(10) Patent No.: US 7,259,391 B2
(45) Date of Patent: Aug. 21, 2007

(54) VERTICAL INTERCONNECT FOR ORGANIC ELECTRONIC DEVICES

(75) Inventors: Jie Liu, Niskayuna, NY (US); Anil Raj Duggal, Niskayuna, NY (US); Christian Maria Anton Heller, Albany, NY (US); Donald Franklin Foust, Glenville, NY (US); Tami Janene Faircloth, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 245 days.

(21) Appl. No.: 11/020,338

(22) Filed: Dec. 22, 2004

(65) Prior Publication Data

US 2006/0134822 A1    Jun. 22, 2006

(51) Int. Cl.
*H01L 51/00* (2006.01)
(52) U.S. Cl. .............................. 257/40; 257/E25.008
(58) Field of Classification Search ............... 257/40, 257/E25.008
See application file for complete search history.

(56) References Cited

U.S. PATENT DOCUMENTS

| | | | | |
|---|---|---|---|---|
| 6,541,919 B1* | 4/2003 | Roach et al. | ............. | 315/169.3 |
| 6,693,296 B1* | 2/2004 | Tyan | ............. | 257/40 |
| 7,034,470 B2* | 4/2006 | Cok et al. | ............. | 315/249 |
| 2002/0136925 A1 | 9/2002 | Uchida | ............. | 428/690 |
| 2002/0158577 A1 | 10/2002 | Shimoda et al. | ............. | 313/506 |
| 2003/0113942 A1 | 6/2003 | Lin et al. | ............. | 438/14 |
| 2004/0021425 A1 | 2/2004 | Foust et al. | ............. | 315/169.3 |
| 2004/0238856 A1* | 12/2004 | Makela et al. | ............. | 257/222 |

OTHER PUBLICATIONS

Fix et al. ; "Fast polymer integrated circuits"; Appl. Phys. Lett., vol. 81, No. 9, Aug. 26, 2002; pp. 1735-1737.
Duggal et al.; "Fault-tolerant, scalable organic light-emitting device architecture"; Appl. Phys. Lett., vol. 82, No. 16, Apr. 21, 2003; pp. 2580-2582.
Crone et al.; "Organic oscillator and adaptive amplifier circuits for chemical vapor sensing"; J. Appl. Phys., vol. 91, No. 12, Jun. 15, 2002; pp. 10140-10146.
Gerwin H. Gelinck et al.; "Flexible active-matrix displays and shift registers based on solution-processed organic transistors"; Nature Materials |vol. 3 | Feb. 2004 | www.nature.com/naturematerials: 2004 Nature Publishing Group ; pp. 106-110.

* cited by examiner

*Primary Examiner*—Asok Kumar Sarkar
(74) *Attorney, Agent, or Firm*—Fletcher Yoder

(57) ABSTRACT

A device includes a plurality of organic electronic devices disposed on a substrate, wherein each of the organic electronic devices comprises a first electrode and a second electrode. Furthermore, the device includes an organic layer disposed between the first and second electrodes of each of the plurality of organic electronic devices. Additionally, the device includes an interconnect element, wherein the interconnect element is configured to electrically couple the respective first and second electrodes of each of the plurality of organic electronic devices.

29 Claims, 8 Drawing Sheets

VERTICAL INTERCONNECT FOR ORGANIC ELECTRONIC DEVICES

STATEMENT REGARDING FEDERALLY SPONSORED RESEARCH & DEVELOPMENT

This invention was made with Government support under contract number 70NANB3H3030 awarded by National Institute of Standards and Technology. The Government has certain rights in the invention.

BACKGROUND

The invention relates generally to electronic devices, and more particularly to organic electronic devices.

In recent years, organic electronic devices, such as, but not limited to, organic light emitting devices, organic photovoltaic cells, organic electrochromic devices, organic transistors, organic integrated circuits, or organic sensors, have attracted much attention due to low cost and compatibility with flexible plastic substrates.

Currently, organic electronic devices, such as, but not limited to, organic light emitting devices, are being increasingly employed for applications, such as display applications and area lighting applications. In the last decade, tremendous progress has been made in the area of organic electronic devices. Previously, liquid crystal displays (LCDs) were employed for most display applications. However, the LCD displays involve high production and commercial expenses.

With the imaging appliance revolution underway, the need for more advanced handheld devices that combine the attributes of a computer, personal digital assistant (PDA), and cell phone is increasing. In addition, the need for new lightweight, low power, wide viewing angle devices has fueled an emerging interest in developing flat panel displays while circumventing high production and commercial expenses associated with liquid crystal displays (LCDs). Consequently, the flat panel industry is looking to employ new displays utilizing devices from other technologies, such as organic light emitting devices.

As will be appreciated by one skilled in the art, an organic light emitting device, such as an organic light emitting diode (OLED), includes a stack of thin organic layers sandwiched between two charged electrodes. The organic layers include a hole injection layer, a hole transport layer, an emissive layer, and an electron transport layer. Upon application of an appropriate voltage to the OLED lighting device, where the voltage is typically between 2 and 10 volts, the injected positive and negative charges recombine in the emissive layer to produce light. Further, the structure of the organic layers and the choice of anode and cathode are designed to maximize the recombination process in the emissive layer, thus maximizing the light output from the OLED device. This structure eliminates the need for bulky and environmentally undesirable mercury lamps and yields a thinner, more versatile and more compact display. In addition, the OLEDs advantageously consume little power. This combination of features enables OLED displays to advantageously communicate more information in a more engaging way while adding less weight and taking up less space.

Often, the organic electronic devices, such as OLEDs, include an interconnection between a first layer and a second layer that are separated by an intermediate layer that may be an electro-active or a passive material. As will be appreciated, vertical interconnects are required to electrically couple the first and second layers. Typically, the vertical interconnection is accomplished by patterning a via through the intermediate layer and then depositing a conducting material through the via such that it forms an electrical connection between the first and second layers.

However, the selective patterning of the vias and the deposition of the conducting material may generate debris that may cause defects. Further, the fabrication techniques require additional processing steps. It may therefore be desirable to develop a technique to form an electrical interconnection between two device layers and through an intermediate layer that advantageously circumvents the limitations of current techniques.

BRIEF DESCRIPTION

Briefly, in accordance with aspects of the present technique, a device is presented. The device includes a plurality of organic electronic devices disposed on a substrate, wherein each of the organic electronic devices comprises a first electrode and a second electrode. Furthermore, the device includes an organic layer disposed between the first and second electrodes of each of the plurality of organic electronic devices. Additionally, the device includes an interconnect element, wherein the interconnect element is configured to electrically couple the respective first and second electrodes of each of the plurality of organic electronic devices.

In accordance with another aspect of the present technique, a device is presented. The device includes a plurality of organic electronic devices disposed on a substrate, wherein each of the organic electronic devices comprises a first electrode and a second electrode. Additionally, the device includes an organic layer disposed between the first and second electrodes of each of the plurality of organic electronic devices. The device also includes an interconnect element, wherein the interconnect element is configured to electrically couple a first electrode of a first organic electronic device and a first electrode of a second organic electronic device disposed adjacent to the first organic electronic device.

In accordance with yet another aspect of the present technique, a device is presented. The device includes a plurality of organic electronic devices disposed on a substrate, wherein each of the organic electronic devices comprises a first electrode and a second electrode. In addition, the device includes an organic layer disposed between the first and second electrodes of each of the plurality of organic electronic devices. Furthermore, the device includes a first interconnect element disposed on the organic layer, wherein the first interconnect element is configured to provide series electrical coupling between the first and second electrodes of a first and second organic electronic devices disposed adjacent to each other. The device also includes a second interconnect element disposed on the organic layer, wherein the second interconnect element is configured to provide parallel electrical coupling between the first and second electrodes of the first and second organic electronic devices disposed adjacent to each other.

In accordance with further aspects of the present technique, an interconnect structure is presented. The interconnect structure includes a first conductive layer. Further, the interconnect structure includes an organic layer disposed on the first conductive layer. In addition, the interconnect layer includes one or more interconnecting elements disposed through the organic layer, wherein each of the one or more interconnecting elements comprises a non-conductive material having one or more conductive elements therethrough.

The interconnect structure also includes a second conductive layer electrically coupled to the first conductive layer through at least one of the one or more conductive elements of the one or more interconnecting elements.

In accordance with further aspects of the present technique, a method of fabricating an organic electronic device is presented. The method includes providing a first conductive layer. The method also includes disposing an organic material layer onto the first conductive layer. Further, the method includes providing a second conductive layer. In addition, the method includes disposing an interconnect element on one of the first conductive layer or the organic material layer. Additionally, the method includes electrically coupling the first and second conductive layers via the interconnect element.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Organic materials are poised to transform the world of circuit and display technology and have been attracting much attention due to low cost and high performance offered by organic electronic devices and opto-electronic devices. For example, organic electronic device displays have been attracting much attention in recent years for their superior performance in the areas of contrast, thinness, power consumption, lightness, response speed and viewing angle. As will be appreciated, the OLED structure typically consists of a stack of thin organic layers sandwiched between two charged electrodes. Typically, the interconnection is accomplished by patterning a via through an intermediate layer disposed between a first layer and a second layer and then depositing a conducting material through the via such that it forms an electrical connection between the first and second layers. However, formation of the vias and the deposition of the conducting material may generate debris that may cause defects. The techniques discussed herein address some or all of these issues.

Figure 1:
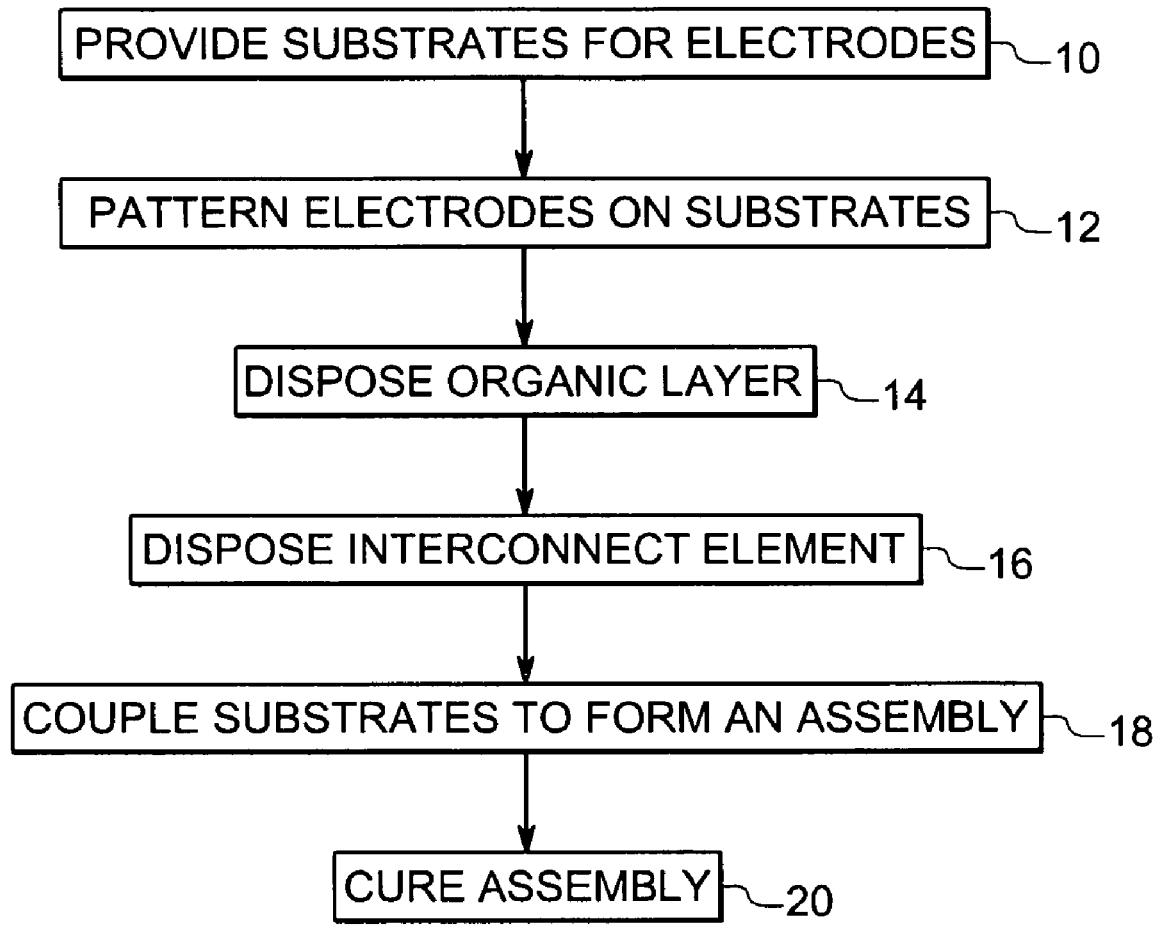
FIG. 1 depicts a flow chart illustrating steps for forming a device, according to aspects of the present technique.

FIG. 1 is a flow chart illustrating an exemplary method for fabricating a device in accordance with aspects of the present technique. The device may include a plurality of organic electronic devices. Further, each of the plurality of organic electronic devices includes a respective first electrode and a second electrode. In one embodiment, the device may include at least a first organic electronic device and a second organic electronic device, where each of the first and second organic electronic devices includes respective first and second electrodes. Each of the plurality of organic electronic devices may include one of an organic light emitting device, an organic photovoltaic cell, an organic electrochromic device, an organic transistor, an organic integrated circuit, an organic sensor, or a photo-detector.

The method summarized in FIG. 1 begins at step 10. In step 10, a first substrate and a second substrate are provided. In one embodiment, the first substrate, the second substrate or both may include a flexible substrate, such as, but not limited to, plastic, a metal foil, or flexible glass. Alternatively, the first substrate and/or the second substrate may include non-flexible substrates, such as, but not limited to plastic, glass, silicon, a metal foil or combinations thereof.

At step 12, a plurality of first electrodes may be patterned on the first substrate. In one embodiment each of the plurality of first electrodes may include an anode. The plurality of first electrodes may include a first material that is transparent to the light emitted by the device. For example, the first material may include indium tin oxide (ITO), or tin oxide. In addition, a thickness of the first electrode may be in a range from about 10 nm to about 100 µm, preferably in a range from about 10 nm to about 1 µm, more preferably in a range from about 10 nm to about 200 nm and even more preferably in a range from about 50 nm to about 200 nm. In certain embodiments, the plurality of first electrodes may include a first material that is transparent to the light absorbed by the device. Furthermore, in certain other embodiments, the plurality of first electrodes may include a first material that is transparent to the light modulated by the device.

Further, at step 12, a plurality of second electrodes may be patterned on the second substrate. In one embodiment, each of the plurality of second electrodes may include a cathode. The plurality of second electrodes may include a second material that is transparent to light emitted by the device. For example, the second material may include one of ITO or a metal, such as Aluminum (Al) or silver (Ag). Also, the thickness of the second electrode may be in a range from about 10 nm to about 100 µm, preferably in a range from about 10 nm to about 1 µm, more preferably in a range from about 10 nm to about 200 nm and even more preferably in a range from about 50 nm to about 200 nm. In certain embodiments, the plurality of second electrodes may include a second material that is transparent to the light absorbed by the device. Furthermore, in certain other embodiments, the plurality of second electrodes may include a second material that is transparent to the light modulated by the device.

Subsequently, at step 14, one or more organic layers may be disposed on at least one of the plurality of first electrodes, the plurality of second electrodes or both. The organic layers may serve as an intermediate layer between the respective electrodes of each of the plurality of organic electronic devices. Typically, the thickness of the organic layer may be in a range from about 1 nm to about 1 µm, preferably in a range from about 1 nm to about 200 nm, more preferably in a range from about 30 nm to about 200 nm and even more preferably in a range from about 30 nm to about 150 nm. Following the deposition of the organic layer at step 14, an interconnect element may be disposed on at least one of the organic layers, at step 16. For example, the interconnect element may be disposed on the organic layer that has been formed on the plurality of first electrodes. Alternatively, the interconnect element may be disposed on the organic layer that has been formed on the plurality of second electrodes.

The interconnect element may facilitate electrical coupling between the respective first and second electrodes of each of the plurality of organic electronic devices. In this embodiment, the electrical coupling may be advantageously achieved without patterning or forming vias through the organic layer. The electrical coupling may include one of a series connection, a parallel connection or combinations thereof. In addition, the interconnect element may also facilitate electrical coupling between one of a first or second electrodes and a bus bar. As will be appreciated, a bus bar may be configured to provide a common connection between the plurality of first and second electrodes. The thickness of the interconnect element may be in a range from about 10 nm to about 200 µm, preferably in a range from about 100 nm to about 100 µm, more preferably in a range from about 1 µm to about 100 µm and even more preferably in a range from about 10 µm to about 100 µm. Additionally, the interconnect element may also be employed to advantageously provide desirable mechanical properties, such as, but not limited to, enhanced interfacial bonding. Furthermore, the interconnect element may also be employed to provide electrical coupling between the device and an external device as will be explained in greater detail hereinafter.

In accordance with an exemplary embodiment of the present technique, the interconnect element may include an interconnect layer. The interconnect layer may include a non-conductive matrix having conductive fillers disposed therethrough. The non-conductive matrix may include an organic material. Typically, the non-conductive matrix may include an insulating material that may be cured upon application of heat, pressure and/or irradiation. Also, the non-conductive matrix may include a material that is different from the material employed to form the one or more organic layers. In a presently contemplated configuration, the non-conductive matrix may include an adhesive material. Alternatively, the non-conductive matrix may also include materials, such as, but not limited to, epoxy, acrylic or thermoplastics.

Further, in a presently contemplated configuration, the conductive fillers that may be dispersed in the non-conductive matrix may include solid particles of metal, such as, but not limited to, nickel, gold, and silver. Additionally, the conductive fillers may include solid particles of conductive metal oxides, such as, but not limited to, indium tin oxide, or tin oxide. Alternatively, the conductive fillers may include particles having a non-conductive core coated with a conductive coating. For example, the conductive fillers may include plastic and/or resin particles coated with a metal. Additionally, the conductive fillers may include fibers of a conductive material. Also, the conductive fillers may exhibit a spherical shape or an irregular shape.

In this embodiment, the size of the conductive fillers may be approximately in a range from about 10 nm to about 200 µm, preferably in a range from about 100 nm to about 100 µm, more preferably in a range from about 1 µm to about 100 µm and even more preferably in a range from about 10 µm to about 100 µm. As previously mentioned, the thickness of the non-conductive matrix may be in a range from about 10 nm to about 200 µm, and preferably in a range from about 100 nm to about 100 µm. Also, the thickness of the organic layer is approximately in a range from about 1 nm to about 1 µm, preferably in a range from about 1 nm to about 200 nm, more preferably in a range from about 30 nm to about 200 nm and even more preferably in a range from about 30 nm to about 150 nm. It may be noted that, in one embodiment, the size of the conductive fillers is substantially larger than the thickness of the non-conductive matrix. Consequently, in this embodiment, the conductive fillers may be configured to protrude from the surface of the non-conductive matrix. Alternatively, the size of the conductive fillers may also be substantially smaller than the thickness of the non-conductive matrix. Consequently, the conductive fillers may be configured to protrude from the surface of the non-conductive matrix upon the application of heat and/or pressure.

With continuing reference to the interconnect element, the interconnect element may be in a solid form. For example, the interconnect element in a solid form may include one of a tape or a film. Alternatively, the interconnect element may be in a liquid state. For example, the interconnect element may include one of paste or an ink.

Furthermore, the interconnect element may include a substantially structured layer. In other words, the conductive fillers may be distributed in a unique pattern in the non-conductive matrix. Additionally, the position of the conductive fillers in the non-conductive matrix may be fixed. Furthermore, the density of the conductive fillers in the non-conductive matrix may be low. In other words, the conductive fillers are disposed such that no two proximately disposed conductive fillers are in physical contact. Typically, a minimum pitch between conductive fillers may be, for example, 30 µm. In addition, as previously mentioned, the diameter of the conductive fillers may be substantially greater than the thickness of the non-conductive matrix, which advantageously allows the conductive fillers to punch through the non-conductive matrix to electrically couple two electrodes.

Based upon the distribution pattern of the conductive fillers in the non-conductive matrix, the interconnect element may be configured to include an isotropic material or an anisotropic material. In one embodiment, the interconnect element may include an isotropic material. As will be appreciated, an isotropic material is one that exhibits similar conduction in any given direction, such as X, Y and Z directions. Accordingly, the conductive fillers may be distributed in a random fashion in the non-conductive matrix to facilitate conduction in the X, Y and Z directions. For example, the isotropic material employed to form the interconnect element may include one of an ARclad® 8001 (Adhesive research Inc, PA, USA), 1692 Transfer (50 micron electrical conductive unsupported transfer adhesive) (Kemtron Ltd, United Kingdom), 3M™ XYZ-Axis Electrically Conductive Tape 9712 or 3M™ XYZ-Axis Electrically Conductive Tape 9713.

Alternatively, the interconnect element may include an anisotropic material. As will be appreciated, an anisotropic material is a material that exhibits different conduction in different directions. For example, the anisotropic material may be configured to conduct only in one direction, such as the Z direction. Accordingly, the conductive fillers are arranged in the non-conductive matrix such that the conductive fillers disposed in the X and Y directions do not touch, thereby enabling conduction only in the Z direction. For example, the anisotropic material employed to form the interconnect element may include one of an ARclad® 9032 (Adhesive research Inc, PA, USA), 3M Z-axis adhesive film 5303R (3M, MN, USA), 3M Z-axis adhesive film 5352R (3M, MN, USA), 3M Z-axis adhesive film 5460R (3M, MN, USA), 3M Z-axis adhesive film 5552R (3M, MN, USA), 3M Z-axis adhesive film 7303R (3M, MN, USA) or 3M Z-axis electrical conductive tape 9703 (3M, MN, USA).

Subsequent to the disposing of the interconnect element at step 16, the first and second substrates may be coupled to form an assembly at step 18. In step 18, the second substrate may be disposed such that the plurality of second electrodes disposed on the second substrate is positioned substantially opposite the plurality of first electrodes disposed on the first substrate.

According to aspects of the present technique, the coupling between the first and second substrates may be accomplished via applying pressure to the formed assembly. Consequent to the application of pressure, the conductive fillers disposed in the non-conductive matrix punch through the surface of the non-conductive matrix. Further, the protruding conductive fillers also punch through the organic layers that may be disposed between the plurality of first and second electrodes. In addition, the conductive fillers also punch into the plurality of first and second electrodes, thereby establishing desired electrical coupling between the plurality of first and second electrodes. Alternatively, the coupling between the first and second substrates may be formed via heating the assembly to cause the conductive fillers to punch through the non-conductive matrix, the organic layers and into the plurality of first and second electrodes. Further, a combination of application of pressure and heat may be employed to couple the first and second substrates to form the assembly wherein the conductive fillers provide electrical connection between the electrodes.

In accordance with further aspects of the present technique, the assembly may be cured at step 20. In one embodiment, the assembly may be cured via heating the assembly. Alternatively, the assembly may be cured by exposing the assembly to ultra-violet radiation. As will be appreciated by one skilled in the art, in a condition where the interconnect element is formed using a thermoset material, the interconnect element may be cured only one time. However, in the condition where the interconnect element is formed employing a thermoplastic material, the interconnect element may be reset and recured multiple times.

The device that may be formed employing the method described hereinabove may include a plurality of organic electronic devices. Accordingly, the device may include at least a first organic electronic device and a second organic electronic device having respective first and second electrodes, where the first and second organic electronic devices may be disposed adjacent to each other.

Figure 2:
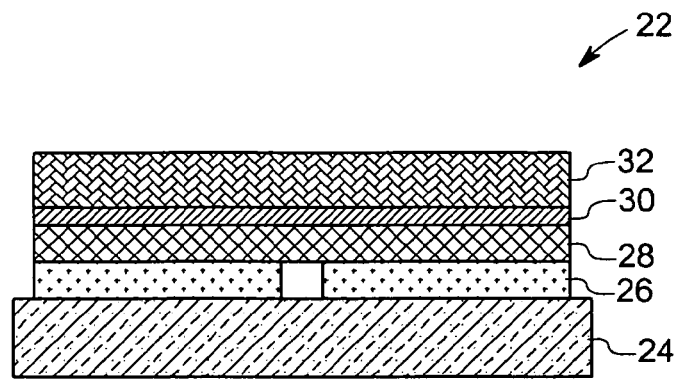
FIG. 2 illustrates a first cross-sectional side view of a first exemplary embodiment of a device, according to aspects of the present technique.

Turning to FIG. 2, a first cross-sectional side view 22 of a first exemplary embodiment of a device is illustrated. As will be appreciated by one skilled in the art, the figures are for illustrative purposes and are not drawn to scale. In a presently contemplated configuration, the device is illustrated diagrammatically as including a substrate 24. In one embodiment, the substrate 24 may include a flexible substrate. For example, the flexible substrate 24 may include a flexible substrate that is compatible with roll-to-roll processing. The flexible substrate 24 is generally thin, having a thickness in a range from about 0.25 mils to about 50.0 mils, and preferably in a range from about 0.5 mils to about 10.0 mils. The term "flexible" generally means being capable of being bent into a shape having a radius of curvature of less than approximately 100 cm. Advantageously, implementing a roll of film for the flexible substrate 24 enables the use of high-volume, low cost, reel-to-reel processing and fabrication of the device. The roll of film may have a width of 1 foot, for example, on which a number of components (e.g., organic electronic devices) may be fabricated. The flexible substrate 24 may comprise a single layer or may comprise a structure having a plurality of adjacent layers of different materials. By using rollable substrates, manufacturability of the device may be improved.

The flexible substrate 24 generally comprises any flexibly suitable polymeric material. For instance, the flexible substrate 24 may comprise polycarbonates, polyarylates, polyetherimides, polyethersulfones, polyimides, such as Kapton H or Kapton E (made by Dupont) or Upilex (made by UBE Industries, Ltd.), polynorbornenes, such as cyclic-olefins (COC), liquid crystal polymers (LCP), such as polyetheretherketone (PEEK), polyethylene terephthalate (PET), polyethylene naphtalate (PEN), metal foil, and flexible glass. Alternatively, the substrate 24 may include a non-flexible substrate, such as silicon, glass, or plastic.

Further, a plurality of first electrodes 26 may be patterned on the substrate 24. In one embodiment each of the plurality of first electrodes 26 may be an anode. The first electrodes 26 may include a material such as, but not limited to, indium tin oxide (ITO). Also, the thickness of the first electrodes 26 may be in a range from about 10 nm to about 100 µm, preferably in a range from about 10 nm to about 1 µm, more preferably in a range from about 10 nm to about 200 nm and even more preferably in a range from about 50 nm to about 200 nm. Additionally, in the illustrated embodiment, a layer of organic material 28 may be disposed on the plurality of first electrodes 26. The organic material 28 may serve as an intermediate layer between layers of the device. The organic material may include one of a light-emitting material, a light-absorbing material, or an electrochromophore. In another embodiment, the organic material may also include a non-organic material dispersed in an organic matrix. The non-organic material may include photoluminescent materials, such as inorganic phosphors, or electro-active materials, such as metal oxides. For example, the electro-active materials may include metal oxides, such as titanium oxide or tungsten oxide.

In accordance with an exemplary embodiment of the present technique, an interconnect element 30 may be disposed on the organic layer 28. The interconnect element 30 may be configured to electrically couple two electrodes in the device. The thickness of the interconnect layer 30 may be in a range from about 10 nm to about 200 mm, preferably in a range from about 100 nm to about 100 μm, more preferably in a range from about 1 μm to about 100 μm and even more preferably in a range from about 10 μm to about 100 μm.

In one exemplary embodiment, the interconnect element 30, such as an interconnect layer may, as previously explained, include a non-conductive matrix (not shown). The non-conductive matrix may include organic materials, such as, but not limited to, an adhesive material, acrylic or epoxy. In addition, a plurality of conductive fillers (not shown) may be dispersed in the non-conductive matrix. Furthermore, a plurality of second electrodes 32 may be disposed on the interconnect layer.

Figure 3:
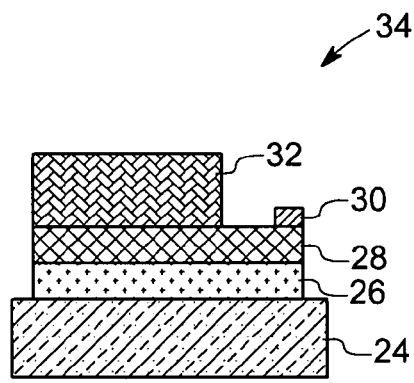
FIG. 3 illustrates a second cross-sectional side view of a first exemplary embodiment of a device, according to aspects of the present technique.
Figure 4:
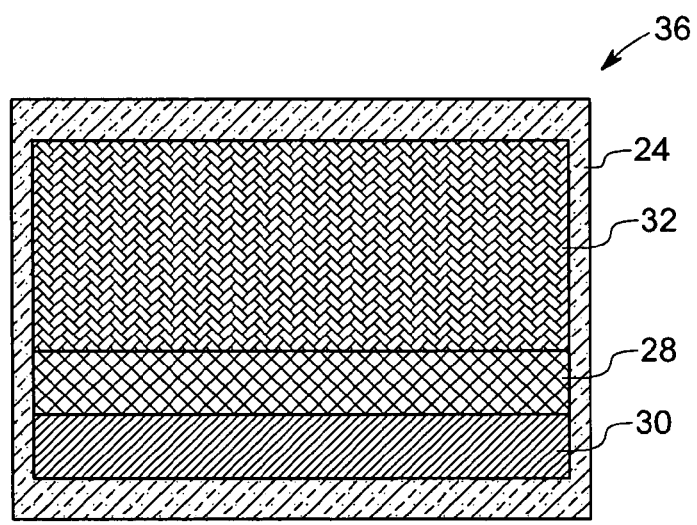
FIG. 4 illustrates a top view of a first exemplary embodiment of a device, according to aspects of the present technique.

Further, a second cross-sectional side view 34 of the first exemplary embodiment of the device is illustrated in FIG. 3. The interconnect element 30, as depicted in the second cross-sectional side view 34, may also be employed to facilitate an external connection. Also, illustrated in FIG. 4 is a top view 36 of the first exemplary embodiment of the device, in accordance with aspects of the present technique. Furthermore, the device may include a power source (not shown) configured to provide voltage to the plurality of organic electronic devices.

In the illustrated embodiments of FIGS. 2-4, the interconnect element 30 facilitates a parallel connection coupling a first electrode of the first organic electronic device to a first electrode of the second organic electronic device. In one embodiment, the first electrodes of the first and second organic electronic devices may be anodes. Thus, the illustrated embodiments of FIGS. 2-4 depict a parallel coupling between the anodes of two organic electronic devices that may be disposed adjacent to one another. Alternatively, the first electrodes of the first and second organic electronic devices may be cathodes.

Figure 5:
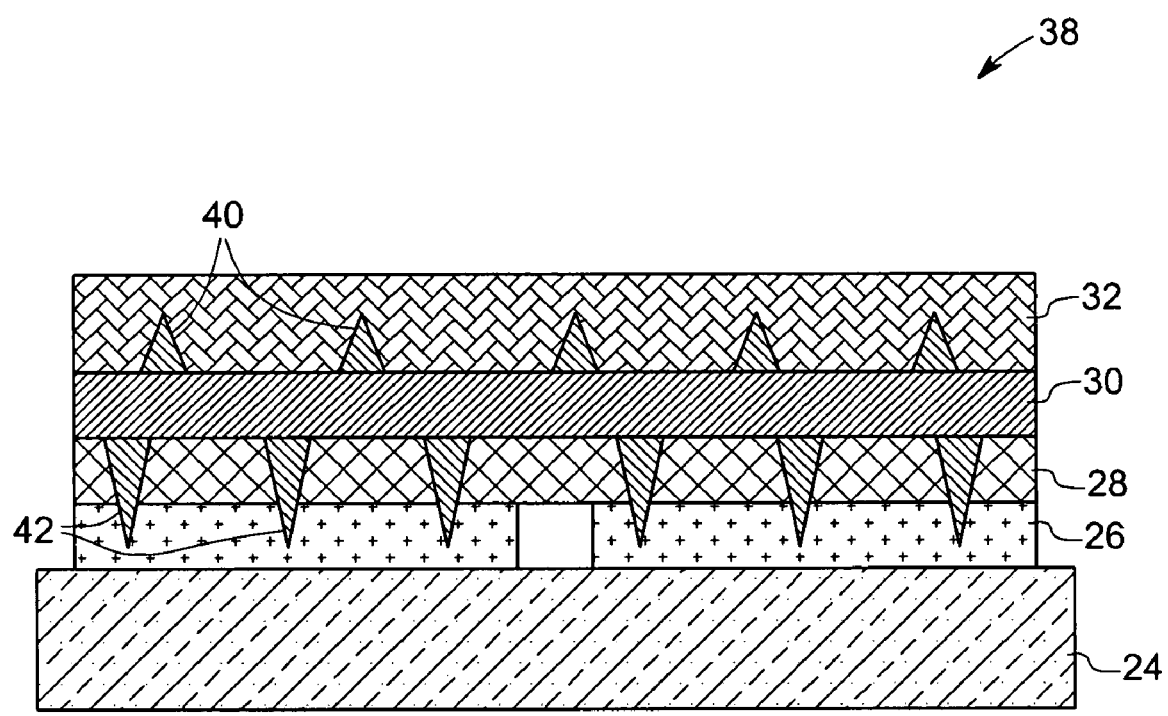
FIG. 5 illustrates a cross-sectional side view of an exemplary embodiment of the device depicting the punch through mechanism, according to aspects of the present technique.

FIG. 5 illustrates a detailed cross-sectional side view 38 of the device, according to aspects of the present technique. In the illustrated embodiment, a punch through mechanism of the conductive fillers 40, 42 disposed in the non-conductive matrix of the interconnect element 30, such as an interconnect layer, is exemplified. As will be appreciated, the illustration is not drawn to scale. Furthermore, as previously explained, the first and second electrodes may be electrically coupled via the interconnect layer 30 by the application of heat and/or pressure. The application of heat and/or pressure causes the conductive fillers 40, 42 to protrude through the surface of the interconnect layer. In addition, as depicted in the illustrated embodiment of FIG. 5, a first set of conductive fillers 40 punch into the plurality of second electrodes 32. Furthermore, a second set of conductive fillers 42 punch through the organic layer 28 and into the plurality of first electrodes 26, thereby establishing electrical coupling between the plurality of first electrodes 26 and the plurality of second electrodes 32.

Figure 6:
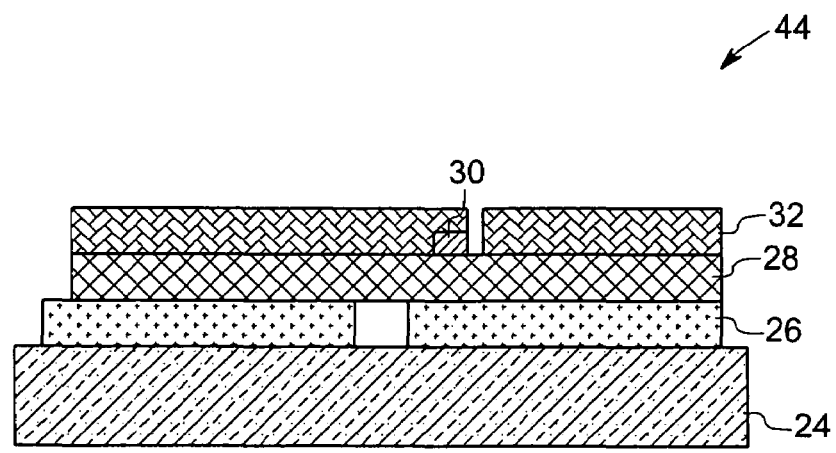
FIG. 6 illustrates a first cross-sectional side view of a second exemplary embodiment of a device, according to aspects of the present technique.
Figure 7:
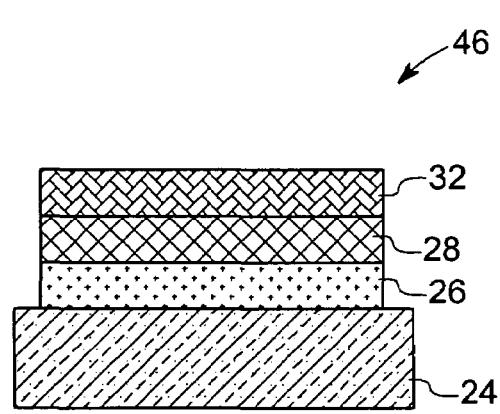
FIG. 7 illustrates a second cross-sectional side view of a second exemplary embodiment of a device, according to aspects of the present technique.
Figure 8:
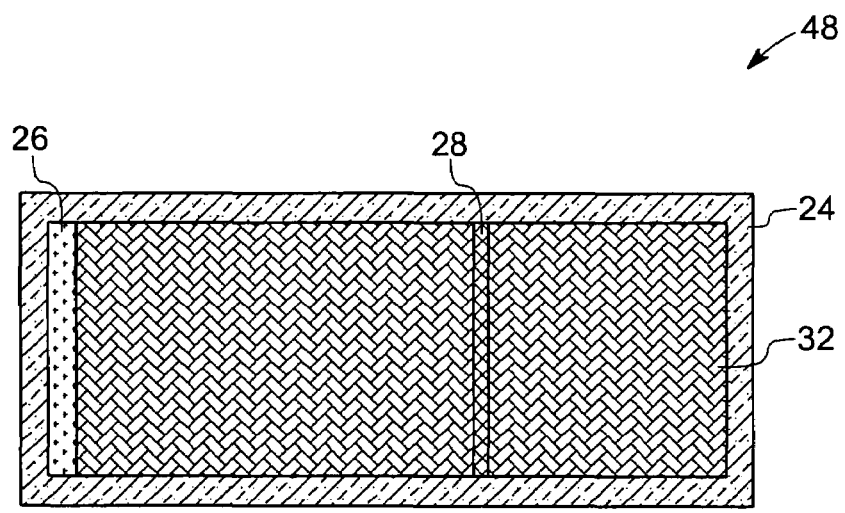
FIG. 8 illustrates a top view of a second exemplary embodiment of a device, according to aspects of the present technique.

FIG. 6 illustrates a first cross-sectional side view 44 of a second exemplary embodiment of a device, according to aspects of the present technique. Further, a second cross-sectional side view 46 of the second exemplary embodiment is illustrated in FIG. 7. A top view 48 of the second exemplary embodiment is illustrated in FIG. 8. In the illustrated embodiments of FIGS. 6-8, the interconnect element 30 is disposed on the organic layer 28. The interconnect element 30 in these embodiments is configured to facilitate a series connection coupling a second electrode of the first organic electronic device to a first electrode of the second organic electronic device. In one embodiment, the second electrode of the first organic electronic device may be a cathode and the first electrode of the second organic electronic device may be an anode. Consequently, the illustrated embodiments of FIGS. 6-8 depict a series coupling between the cathode of the first organic electronic device and the anode of the second organic electronic device. As previously mentioned, the conductive fillers 40, 42 disposed in the non-conductive matrix (see FIG. 5) may provide the series coupling between the cathode of the first organic electronic device and the anode of the second organic electronic device.

Figure 9:
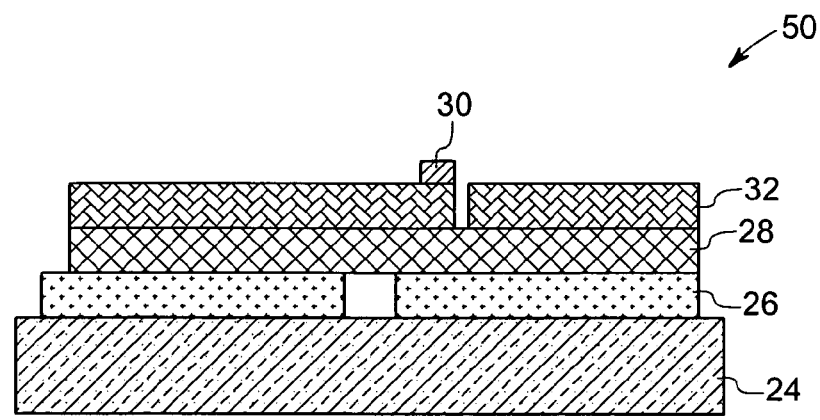
FIG. 9 illustrates a first cross-sectional side view of a third exemplary embodiment of a device which is an alternate exemplary embodiment of the device of FIG. 6, according to aspects of the present technique.
Figure 10:
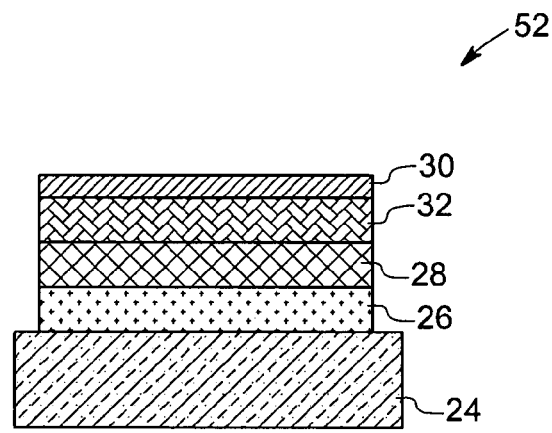
FIG. 10 illustrates a second cross-sectional side view of a third exemplary embodiment of a device which is an alternate exemplary embodiment of the device of FIG. 7, according to aspects of the present technique.
Figure 11:
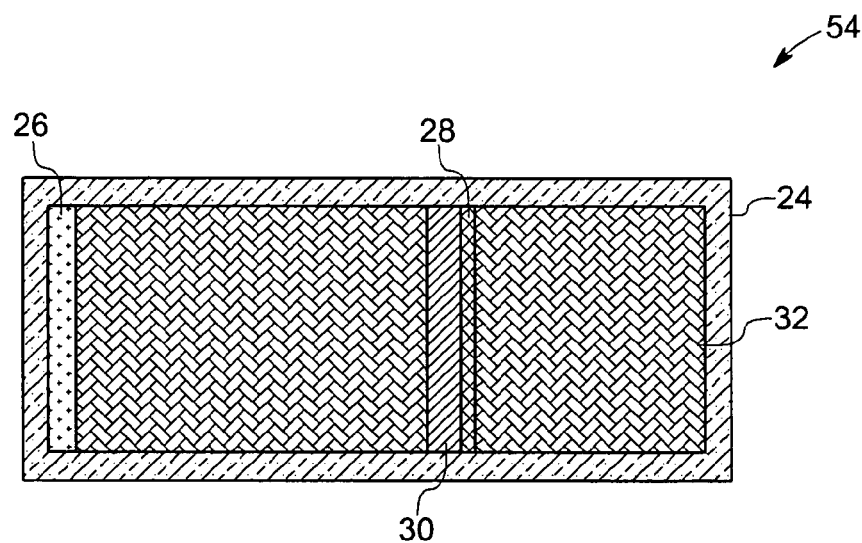
FIG. 11 illustrates a top view of a third exemplary embodiment of a device which is an alternate exemplary embodiment of the device of FIG. 8, according to aspects of the present technique.

A first cross-sectional side view 50 of a third exemplary embodiment of a device is illustrated in FIG. 9, according to aspects of the present technique. The illustrated embodiment of FIG. 9 represents an alternate embodiment of the embodiment illustrated in FIG. 6. Further, a second cross-sectional side view 52 of the third exemplary embodiment is illustrated in FIG. 10. In addition, a top view 54 of the third exemplary embodiment is illustrated in FIG. 11. In the embodiments illustrated in FIGS. 9-11, the interconnect element 30 is disposed on the second electrode 32. The interconnect element 30 in these embodiments is configured to facilitate a series connection coupling a second electrode of the first organic electronic device to a first electrode of the second organic electronic device. In one embodiment, the second electrode of the first organic electronic device may be a cathode and the first electrode of the second organic electronic device may be an anode. Consequently, the illustrated embodiments of FIGS. 9-11 depict a series coupling between the cathode of the first organic electronic device and the anode of the second organic electronic device.

Figure 12:
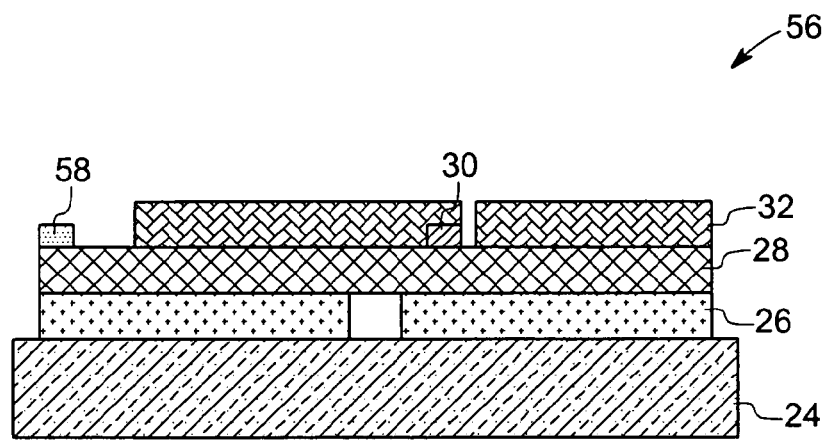
FIG. 12 illustrates a first cross-sectional side view of a fourth exemplary embodiment of a device, according to aspects of the present technique.

Referring now to FIG. 12, a first cross-sectional side view 56 of a fourth exemplary embodiment of a device, according to aspects of the present technique, is illustrated. The illustrated embodiment may be configured to facilitate a combination of series and parallel connections between the first and second electrodes of the respective first and second organic electronic devices.

In a presently contemplated configuration, the device may include two interconnect elements. A first interconnect element 30 may be configured to provide a series connection coupling a second electrode of the first organic electronic device to a first electrode of the second organic electronic device. In one embodiment, the second electrode of the first organic electronic device may be a cathode and the first electrode of the second organic electronic device may be an anode. Consequently, the illustrated embodiment depicts a series coupling between the cathode of the first organic electronic device and the anode of the second organic electronic device.

Furthermore, a second interconnect element 58, such as a second interconnect layer including a non-conductive matrix having conductive fillers disposed therethrough may be provided. The second interconnect layer 58 may be configured to facilitate a parallel connection coupling a first electrode of the first organic electronic device to a first electrode of the second organic electronic device. In one embodiment, the first electrode of the first organic electronic device may be an anode and the first electrode of the second organic electronic device may be an anode. Consequently, the illustrated embodiment depicts a parallel coupling between the anode of the first organic electronic device and the anode of the second organic electronic device. However, as will be appreciated, the illustrated embodiment may also be configured to provide a parallel coupling between a cathode of the first organic electronic device and a cathode of the second organic electronic device.

Figure 13:
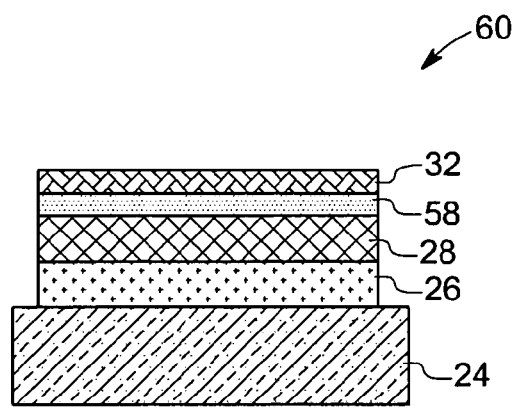
FIG. 13 illustrates a second cross-sectional side view of a fourth exemplary embodiment of a device, according to aspects of the present technique.
Figure 14:
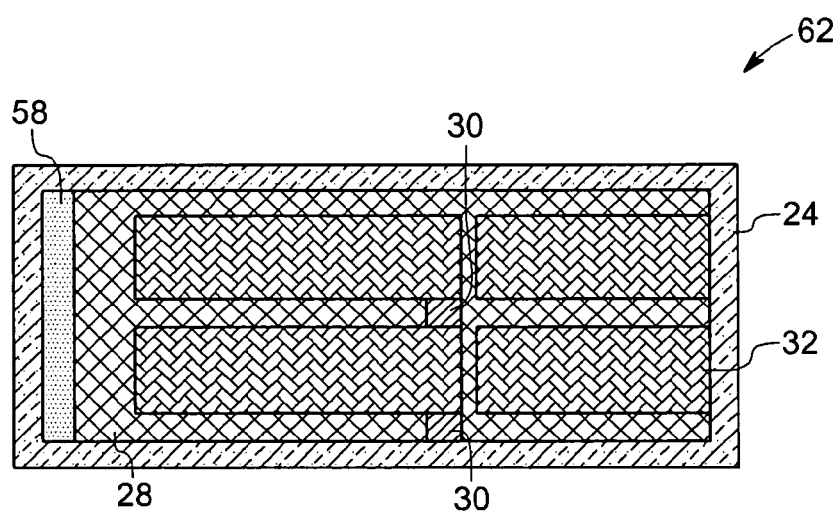
FIG. 14 illustrates a top view of a fourth exemplary embodiment of a device, according to aspects of the present technique.

FIG. 13 illustrates a second cross-sectional side view 60 of the fourth exemplary embodiment of the device. A top view 62 of the fourth exemplary embodiment of the device, according to aspects of the present technique, is illustrated in FIG. 14. Additionally, the first interconnect element 30 may be formed employing a first material. The second interconnect element 58 may be formed employing a second material, where the second material is different from the first material. Alternatively, the first and second interconnect elements 30, 58 may be formed employing a material, such as the first material.

Figure 15:
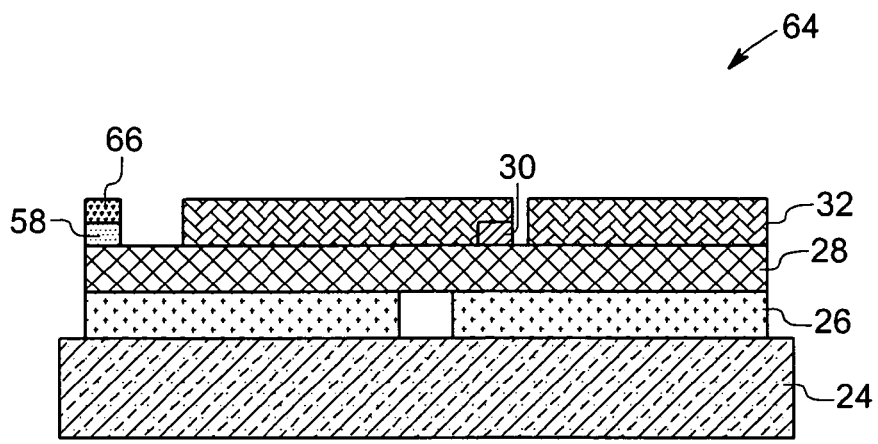
FIG. 15 illustrates a first cross-sectional side view of a fifth exemplary embodiment of a device, according to aspects of the present technique.

Turning to FIG. 15, a first cross-sectional side view 64 of a fifth embodiment of a device is illustrated. As previously explained with reference to FIGS. 12-14, the illustrated embodiment of FIG. 15 may be configured to facilitate a combination of series and parallel connections between the first and second electrodes of the respective first and second organic electronic devices.

Figure 16:
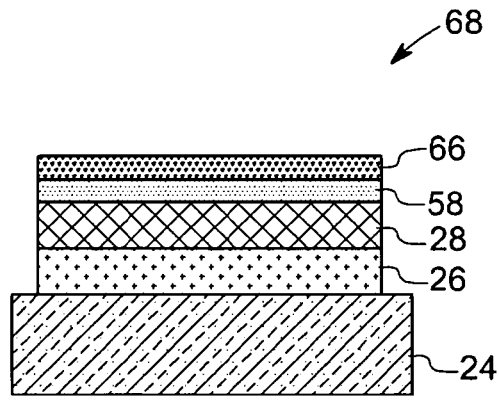
FIG. 16 illustrates a second cross-sectional side view of a fifth exemplary embodiment of a device, according to aspects of the present technique.
Figure 17:
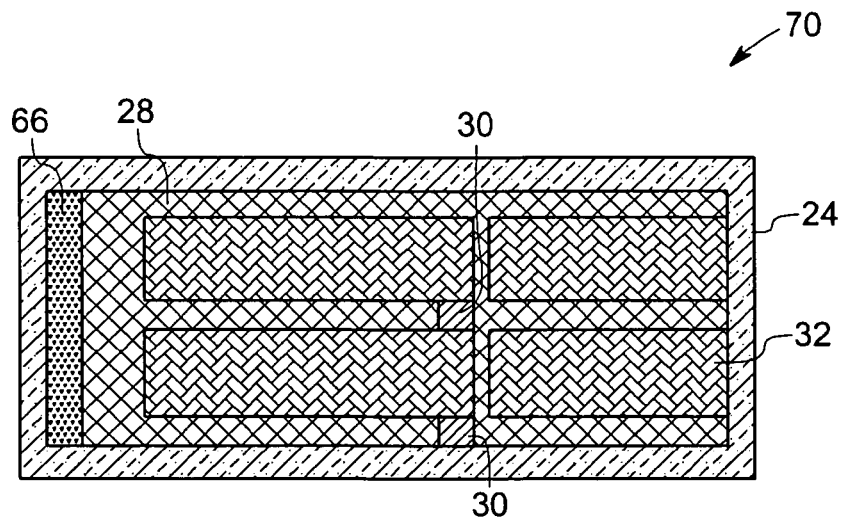
FIG. 17 illustrates a top view of a fifth exemplary embodiment of a device, according to aspects of the present technique.

Furthermore, the illustrated embodiment of FIG. 15 may include a bus bar 66. The bus bar 66 may be configured to provide a parallel connection coupling a first electrode of the first organic electronic device and a first electrode of the second organic electronic device. In one embodiment, each of the first electrodes of the first and second organic electronic devices may include an anode. In addition, a second electrode of the first organic electronic device may be coupled in series with a first electrode of the second organic electronic device via the first interconnect element 30. FIG. 16 illustrates a second cross-sectional side view 68 of a fifth exemplary embodiment of a device, according to aspects of the present technique. In addition, a top view 70 of a fifth exemplary embodiment of a device is illustrated in FIG. 17.

Figure 18:
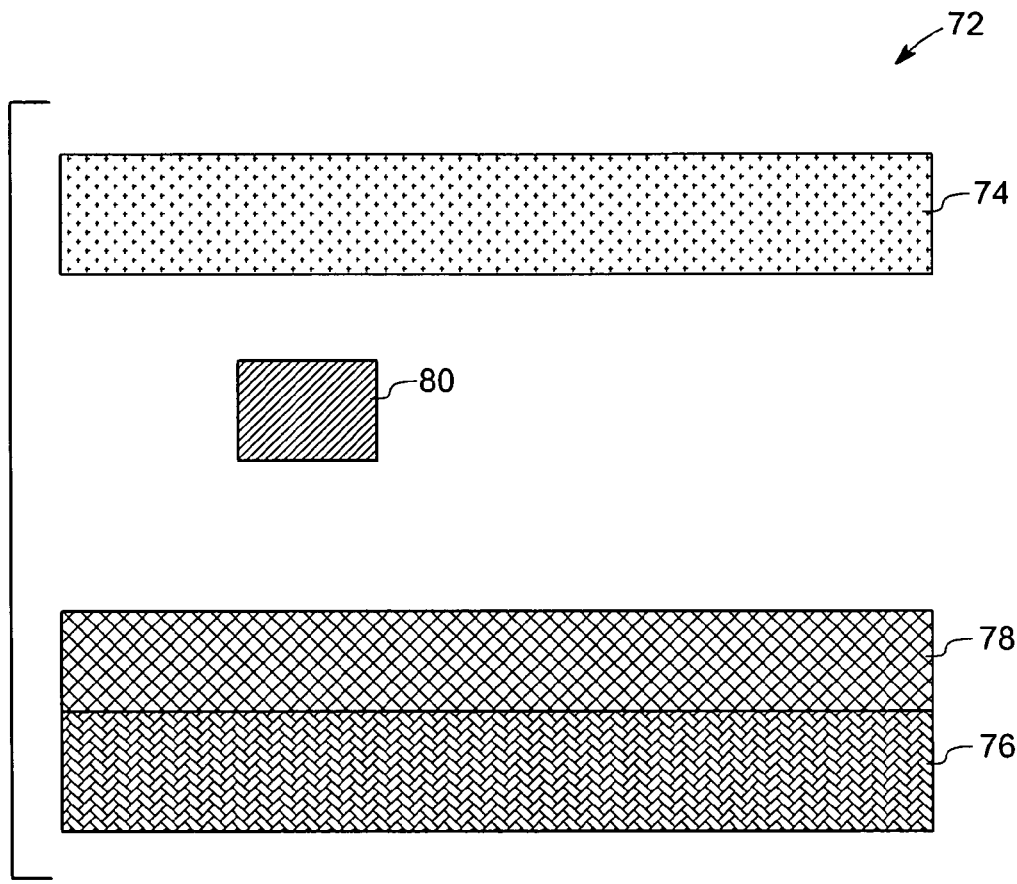
FIG. 18 illustrates a cross-sectional side view of an exemplary embodiment of an interconnect structure prior to assembly.

Turning now to FIG. 18, an exemplary interconnect assembly 72, prior to electrically coupling a first conductive material 74 and a second conductive material 76 is illustrated. The interconnect assembly 72 may include the first conductive material 74 and the second conductive material 76. In one embodiment, the first and second conductive materials 74, 76 may be electrodes of an organic electronic device. In other words, the first conductive material 74 may be an anode and the second conductive material 76 may be a cathode of an organic electronic device. Further, an organic material layer 78 may be disposed on one of the first or second conductive materials 74, 76. In the illustrated embodiment 72, the organic material layer 78 is disposed on the second conductive material 76.

An interconnect element 80 may be disposed on the first conductive layer 74. Alternatively, the interconnect element 80 may be disposed on the organic material layer 78 as illustrated in FIG. 18. In one embodiment, the interconnect element 80 may include a conductive material. Furthermore, in another embodiment, the interconnect element 80 may include a conductive region surrounded by a non-conductive material (not shown). In this embodiment, the interconnect element 80 may be surrounded by the non-conductive material on two sides. A topside and a bottom side of the interconnect element 80 may be exposed to facilitate electrically coupling the first and second conductive materials 74, 76. In another embodiment, the interconnect element 80 may include an interconnect layer. The interconnect layer may include a plurality of conductive regions disposed in a non-conductive matrix, where the plurality of conductive regions may facilitate electrically coupling the first and second conductive materials 74, 76.

Figure 19:
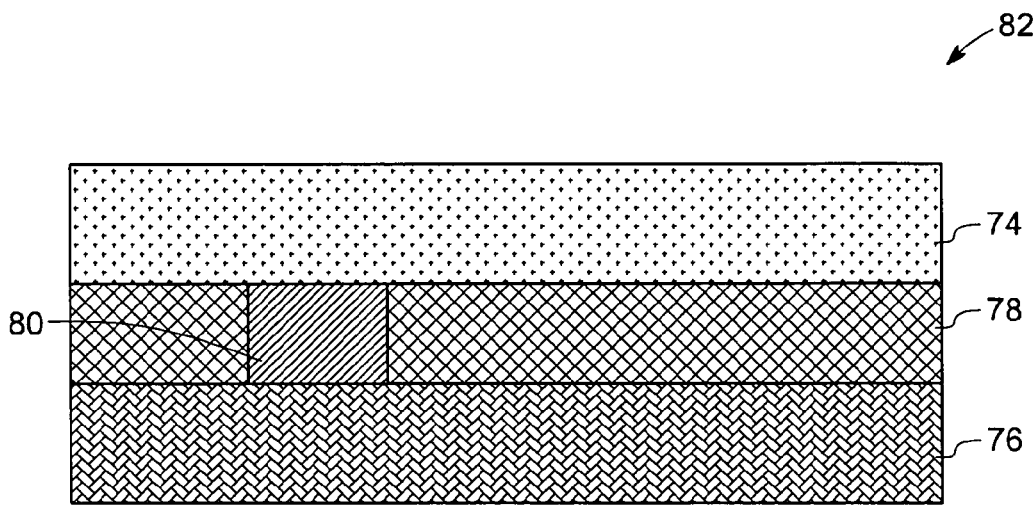
FIG. 19 illustrates a cross-sectional side view of an exemplary embodiment of an interconnect structure.

FIG. 19 illustrates an assembled configuration of an interconnect assembly 82, where the first conductive material 74, the interconnect element 80, the organic material layer 78, and the second conductive material 76 are assembled to form the interconnect assembly 82. The interconnect assembly 82 may be formed by heating the interconnect assembly 82 to facilitate the interconnect element 80 to punch through the organic material layer 78 and into the first and second conductive materials 74, 76. The interconnect element 80 then facilitates establishing a conduction path between the first and second conductive materials 74, 76. Consequently, the first and second conductive materials 74, 76 are electrically coupled via the interconnect element 80. In this embodiment, the first conductive material 74 may not be required to be directly disposed above the organic material layer 78.

Alternatively, the interconnect assembly 82 may be formed by applying pressure to the assembly to facilitate the interconnect element 80 to punch through the organic material layer 78 and into the first and second conductive materials 74, 76. The interconnect assembly 82 may also be formed by exposing the assembly to ultraviolet radiation to facilitate the interconnect element 80 to punch through the organic material layer 78 and into the first and second conductive materials 74, 76. In accordance with aspects of the present technique, a combination of heating, applying pressure and exposing the interconnect assembly 82 to ultraviolet radiation may be employed to form the interconnect assembly 82.

In the embodiment illustrated in FIG. 15, the first interconnect element 30 may include an anisotropic material. However, the second interconnect element 58 may include an isotropic material or an anisotropic material. Also, the first and second interconnect elements 30, 58 may be disposed on the organic layer 28. In addition, the material employed to form the bus bar 66 may be more conductive than the material employed to form the first electrodes 26. However, in the exemplary embodiments illustrated in FIGS. 2-14, the material employed to form the interconnect element 30 may include an isotropic material and/or an anisotropic material.

The various embodiments of the device and the method of fabricating the device described hereinabove enable cost-effective fabrication of devices. Further, employing the method of fabrication described hereinabove, electrical interconnection between two device layers and through an intermediate layer that advantageously circumvents the limitations of current techniques may be achieved. Additionally, the electrical coupling may include a series connection, a parallel connection or a combination thereof. Further, the interconnect layer may be configured to provide mechanical properties such as enhanced interfacial bonding.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A device comprising:
a plurality of organic electronic devices disposed on a substrate, wherein each of the organic electronic devices comprises a first electrode and a second electrode;
an organic layer disposed between the first and second electrodes of each of the plurality of organic electronic devices; and
an interconnect element, wherein the interconnect element comprises an interconnect layer, and wherein the interconnect layer comprises a non-conductive matrix having conductive fillers disposed therethrough, and wherein the conductive fillers protruding out of the non-conductive matrix are electrically coupled to one of the first or second electrode of each of the plurality of organic electronic devices.

2. The device of claim 1, wherein the device comprises a first organic electronic device and a second organic electronic device, and wherein the first and second organic electronic devices comprise a respective first electrode and second electrode.

3. The device of claim 2, wherein each of the respective first electrodes is an anode and each of the respective second electrodes is a cathode.

4. The device of claim 3, wherein each of the first electrodes comprises a first conducting material that is transparent to light emitted, absorbed, modulated, or combinations thereof by the device.

5. The device of claim 3, wherein each of the second electrodes comprises a second conducting material that is transparent to light emitted, absorbed, modulated, or combinations thereof by the device.

6. The device of claim 1, wherein the each of the plurality of organic electronic devices comprises one of an organic light emitting device, an organic photovoltaic cell, an organic photo-detector, an organic electrochromic device, an organic sensor, or combinations thereof.

7. The device of claim 1, wherein the interconnect element is configured to couple at least one of the first or second electrodes to a bus bar.

8. The device of claim 1, wherein the interconnect element comprises an isotropic conductive material, an anisotropic conductive material or a combination thereof.

9. The device of claim 1, wherein the non-conductive. matrix comprises an adhesive material, a thermoplastic material, a thermoset material or combinations thereof.

10. The device of claim 1, wherein the conductive fillers comprise a metal, a non-conductive core having a conductive coating, or combinations thereof.

11. The device of claim 1, wherein the conductive fillers are sized such that they protrude from a surface of the non-conductive matrix.

12. The device of claim 1, wherein the conductive fillers are sized such that they protrude from a surface of the non-conductive matrix after one of a cure treatment, a pressure treatment or both.

13. The device of claim 1, wherein the substrate comprises a flexible substrate.

14. The device of claim 1, wherein the interconnect element is disposed over the organic layer and is configured to electrically couple a first electrode of a first organic electronic device of the plurality of organic electronic devices and a first electrode of a second organic electronic device of the plurality of organic electronic devices disposed adjacent to the first organic electronic device, via protrusions of the conductive fillers penetrating through the organic layer to contact the respective first electrodes of the first and second organic electronic devices, wherein the first and second organic electronic devices are electrically connected in parallel.

15. The device of claim 1, wherein the interconnect element is disposed over the organic layer and is configured to electrically couple, a first electrode of a first organic electronic device of the plurality of organic electronic devices and a second electrode of a second organic electronic device of the plurality of organic electronic devices disposed adjacent to the first organic electronic device, via protrusions of the conductive fillers in contact with the second electrode of the second organic electronic device and via protrusions of the conductive fillers penetrating through the organic layer to contact the first electrode of the first organic electronic device, wherein the first and second organic electronic devices are electrically connected in series.

16. The device of claim 1, wherein the organic layer is a unitary layer between at least two adjacent plurality of organic electronic devices.

17. A device comprising:
a plurality of organic electronic devices disposed on a substrate, wherein each of the organic electronic devices comprises a first electrode and a second electrode;
an organic layer disposed between the first and second electrodes of each of the plurality of organic electronic devices; and
an interconnect element, wherein the interconnect element comprises an interconnect layer, and wherein the interconnect layer comprises a non-conductive matrix having conductive fillers disposed therethrough, and wherein the conductive fillers protruding out of the non-conductive matrix are configured to electrically couple a first electrode of a first organic electronic device and a first electrode of a second organic electronic device disposed adjacent to the first organic electronic device.

18. The device of claim 17, wherein each of the first electrodes is an anode and each of the second electrodes is a cathode.

19. The device of claim 17, wherein the first electrode of the first organic electronic device is an anode and the first electrode of the second organic electronic device is a cathode.

20. A device comprising:
a plurality of organic electronic devices disposed on a substrate, wherein each of the organic electronic devices comprises a first electrode and a second electrode;
an organic layer disposed between the first and second electrodes of each of the plurality of organic electronic devices;
a first interconnect element disposed on the organic layer, wherein the first interconnect element is configured to provide series electrical coupling between first and second electrodes of first and second organic electronic devices disposed adjacent to each other; and
a second interconnect element disposed on the organic layer, wherein the second interconnect element is configured to provide parallel electrical coupling between the first and second electrodes of the first and second organic electronic devices disposed adjacent to each other;
wherein each of the first and second interconnect elements comprises a respective interconnect layer, and wherein each of the interconnect layers comprises a non-conductive matrix having respective conductive fillers disposed therethrough, and wherein the conductive fillers protrude out of the non-conductive matrix.

21. The device of claim 20, wherein each of the organic electronic devices comprises one of an organic light emitting diode, an organic photovoltaic cell, an organic photo-detector, an electrochromic device, an organic sensor, or combinations thereof.

22. The device of claim 20, wherein the first interconnect element comprises a first type of material and the second interconnect element comprises a second type of material, wherein the second type of material is different from the first type of material.

23. The device of claim 20, wherein one of the first interconnect element, the second interconnect element or both comprises an isotropic conductive material, an anisotropic conductive material, or a combination thereof.

24. The device of claim 20, wherein at least one of the respective non-conductive matrices comprises an adhesive material, a thermoplastic material, a thermoset material or combinations thereof.

25. The device of claim 20, wherein at least one of the respective conductive fillers comprises a metal, a non-conductive core having a conductive coating, or combinations thereof.

26. An interconnect structure comprising:
a first conductive layer;
an organic layer disposed on the first conductive layer;
one or more interconnecting elements disposed through the organic layer, wherein each of the one or more interconnecting elements comprises a non-conductive material having one or more conductive elements therethrough, and wherein the conductive fillers protrude out of the non-conductive matrix; and
a second conductive layer electrically coupled to the first conductive layer through at least one of the one or more conductive elements of the one or more interconnecting elements.

27. A method of fabricating an organic electronic device, the method comprising:
providing a first conductive layer;
disposing an organic material layer onto the first conductive layer;
providing a second conductive layer;
disposing an interconnect element on one of the first conductive layer or the organic material layer, wherein the interconnect element comprises an interconnect layer, and wherein the interconnect layer comprises a non-conductive matrix having conductive fillers disposed therethrough and wherein one or more of the conductive fillers protruding out of the non-conductive matrix extends through the organic material layer; and
electrically coupling the first and second conductive layers via the interconnect element to a first or second conductive layer of an adjacent organic electronic device.

28. The method of claim 27, wherein electrically coupling the first and second conductive layers comprises applying pressure to one or both of the first and second conductive layers, heating the first and second conductive layers, exposing the first and second conductive layers to ultraviolet radiation, or combinations thereof.

29. The method of claim 28, wherein electrically coupling comprises electrically coupling such that the interconnect element extends through the organic material layer.

* * * * *